US009580795B2

(12) United States Patent
Miller et al.

(10) Patent No.: US 9,580,795 B2
(45) Date of Patent: Feb. 28, 2017

(54) SPUTTER SOURCE FOR USE IN A SEMICONDUCTOR PROCESS CHAMBER

(71) Applicant: APPLIED MATERIALS, INC., Santa Clara, CA (US)

(72) Inventors: Keith A. Miller, Mountain View, CA (US); Martin Lee Riker, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 395 days.

(21) Appl. No.: 13/785,193

(22) Filed: Mar. 5, 2013

(65) Prior Publication Data
US 2014/0251800 A1 Sep. 11, 2014

(51) Int. Cl.
H01J 37/34 (2006.01)
C23C 14/34 (2006.01)

(52) U.S. Cl.
CPC ...... C23C 14/3407 (2013.01); H01J 37/3408 (2013.01); H01J 37/3411 (2013.01); H01J 37/3455 (2013.01); H01J 37/3497 (2013.01)

(58) Field of Classification Search
CPC .................................................. H01J 37/3455
USPC .................................................... 204/298.16
See application file for complete search history.

(56) References Cited

U.S. PATENT DOCUMENTS

| | | | |
|---|---|---|---|
| 4,714,536 A | 12/1987 | Freeman et al. | |
| 6,024,843 A | 2/2000 | Anderson et al. | |
| 6,689,254 B1* | 2/2004 | Hurwitt | 204/192.12 |
| 8,070,925 B2 | 12/2011 | Hoffman et al. | |
| 2009/0026073 A1 | 1/2009 | Harada et al. | |
| 2009/0090620 A1* | 4/2009 | Pavloff | 204/298.13 |
| 2009/0139854 A1* | 6/2009 | Chang et al. | 204/192.13 |
| 2010/0096261 A1* | 4/2010 | Hoffman et al. | 204/298.08 |
| 2011/0240466 A1 | 10/2011 | Ritchie et al. | |
| 2011/0297537 A1* | 12/2011 | Endo | H01J 37/3452 204/298.16 |
| 2011/0297538 A1 | 12/2011 | Miller et al. | |

OTHER PUBLICATIONS

U.S. Appl. No. 13/761,267, filed Feb. 7, 2013, Miller.
International Search report and Written Opinion mailed Jul. 24, 2014 for PCT Application No. PCT/US2014/018614.

* cited by examiner

Primary Examiner — Keith Hendricks
Assistant Examiner — Timon Wanga
(74) Attorney, Agent, or Firm — Moser Taboada; Alan Taboada

(57) ABSTRACT

In some embodiments, a sputter source for a process chamber may include: a first enclosure having a top, sides and an open bottom; a target coupled to the open bottom; an electrical feed coupled to the top of the first enclosure proximate a central axis of the first enclosure to provide power to the target via the first enclosure; a magnet assembly having a shaft, a support arm coupled to the shaft, and a magnet coupled to the support arm disposed within the first enclosure; a first rotational actuator disposed off-axis to the central axis of the first enclosure and rotatably coupled to the magnet to rotate the magnet about the central axis of the first enclosure; and a second rotational actuator disposed off-axis to the central axis of the first enclosure and rotatably coupled to the magnet to rotate the magnet about a central axis of the magnet assembly.

20 Claims, 4 Drawing Sheets

SPUTTER SOURCE FOR USE IN A SEMICONDUCTOR PROCESS CHAMBER

FIELD

Embodiments of the present invention generally relate to semiconductor processing equipment.

BACKGROUND

Conventional sputter sources that utilize a multi-axis rotational scheme (e.g., universal magnet motion) to position a magnetron typically provide power to a sputter target from a non-central position. However, the inventors have observed that providing power to the sputter target in such a manner results in an uneven and non-symmetrical distribution of power across the sputter target, thereby causing non-uniform sputtering. In addition, conventional sputter sources typically support the sputter target about a peripheral edge of the sputter target. However, the inventors have observed that supporting the sputter target in such a manner causes the sputter target to bow during processing, thereby limiting a thickness, and therefore the useful life, of the sputter target.

Therefore, the inventors have provided embodiments of a sputter source for a process chamber.

SUMMARY

Embodiments of an apparatus for providing plasma to a process chamber are provided herein. In some embodiments, a power source may include a first enclosure having a top, sides and an open bottom; a target coupled to the open bottom of the first enclosure; an electrical feed coupled to the top of the first enclosure proximate a central axis of the first enclosure to provide power to the target via the first enclosure; a magnet assembly having a shaft, a support arm coupled to the shaft, and a magnet coupled to the support arm disposed within the first enclosure; a first rotational actuator disposed off-axis with respect to the central axis of the first enclosure and rotatably coupled to the magnet to rotate the magnet about the central axis of the first enclosure; and a second rotational actuator disposed off-axis with respect to the central axis of the first enclosure and rotatably coupled to the magnet to rotate the magnet about a central axis of the magnet assembly.

In some embodiments, a process chamber for depositing materials atop a substrate may include a substrate support disposed within the process chamber; a sputter source disposed within the process chamber opposite the substrate support, the sputter source comprising; a first enclosure having a top, sides and an open bottom; a target coupled to the open bottom of the first enclosure; an electrical feed coupled to the top of the first enclosure proximate a central axis of the first enclosure to provide power to the target via the first enclosure; a magnet assembly having a shaft, a support arm coupled to the shaft, and a magnet coupled to the support arm disposed within the first enclosure; a first rotational actuator disposed off-axis with respect to the central axis of the first enclosure and rotatably coupled to the magnet to rotate the magnet about the central axis of the first enclosure; and a second rotational actuator disposed off-axis with respect to the central axis of the first enclosure and rotatably coupled to the magnet to rotate the magnet about a central axis of the magnet assembly.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
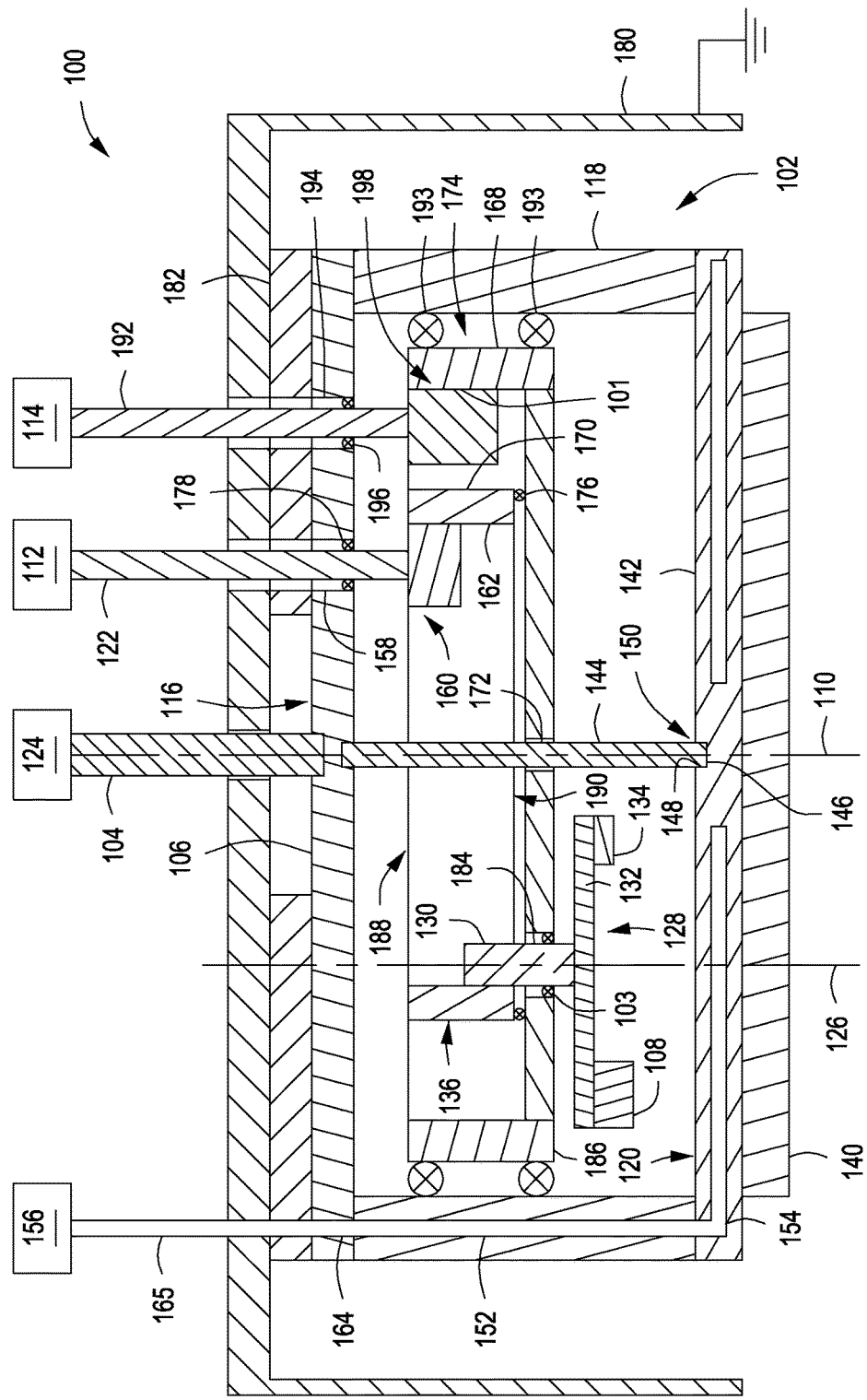
FIG. 1 depicts a sputter source for a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of a sputter source for use in a process chamber are provided herein. In at least some embodiments, the inventive sputter source may advantageously facilitate accurate movement of one or more magnets with respect to a target, thereby facilitating a more precise sputtering process, as compared to conventionally utilized sputter sources. In addition, in at least some embodiments, the inventive sputter source may allow the use of a target having an increased thickness as compared to conventional targets, thereby providing a target with a longer useful life, as compared to conventional targets. In addition, in at least some embodiments, the inventive sputter source may advantageously facilitate more uniform and symmetrical distribution of power provided to a target, thereby providing a more uniform sputtering of material from the target as compared to conventionally utilized sputter sources.

FIG. 1 depicts a sputter source for use in a process chamber in accordance with some embodiments of the present invention. In some embodiments, the sputter source 100 may generally comprise a first enclosure 102, an electrical feed 104, one or more magnets 108, a first rotational actuator 112, a second rotational actuator 114 and a target 140. In some embodiments, a second enclosure 180 may be disposed about the first enclosure 102. In such embodiments, an insulative block 182 may be disposed between the first enclosure 102 and second enclosure 180 to electrically insulate the second enclosure 180 from the first enclosure 102. In some embodiments, the second enclosure 180 may be coupled to ground. When present, the second enclosure 180 may protect the first enclosure 102 and/or prevent a user from contacting an electrically charged first enclosure 102. The second enclosure may be fabricated from any suitable process compatible material, for example, a metal, such as aluminum, an aluminum alloy, stainless steel, or the like.

The first enclosure 102 facilitates delivery of power (e.g., RF or DC power) provided by a power source 124 to the target 140. In some embodiments, the first enclosure 102 includes a top 116, one or more sides 118 and an open bottom 120. The first enclosure 102 may be fabricated from any suitable process compatible conductive material. For example, in some embodiments, the first enclosure 102 may be fabricated from a metal, for example, such as aluminum, an aluminum alloy, stainless steel, or the like. Although described as separate components, the first enclosure 102 may be fabricated from a single piece of material to form the top 116 and sides 118, thereby providing a unitary design.

In some embodiments, the target 140 may be coupled to the open bottom 120 of the first enclosure 120. The target 140 may comprise any materials to be sputtered atop a substrate during a deposition process. For example, in some embodiments, the target 140 may be fabricated from titanium, aluminum, copper, tantalum, tungsten, cobalt, or the like.

In some embodiments, a support column 144 is coupled between the top 116 of the first enclosure 102 and the target 140 proximate a center 150 of the target 140. In some embodiments an end 146 of the support column 144 may be configured to interface with a channel 148 formed in a back side 142 of the target 140 to facilitate coupling the support column 144 to the target 140. When present, the support column 144 supports the center 150 of the target 140 to prevent bowing of the target 140 that may be caused while heating the target 140 during use. By supporting the target 140 via the support column 144 to prevent the above described bowing, the inventors observed that a thickness of the target 140 may be increased, thereby increasing the useful life of the target 140.

In some embodiments, a channel 152 may be formed in the sides 118 of the first enclosure 102 to facilitate delivery of a heat transfer fluid from a heat transfer fluid source 156 to a channel 154 formed in the target 140 to control a temperature of the target 140. In some embodiments, a conduit 165 may be disposed within a through hole 164 formed in the top 106 of the first enclosure 102 the fluidly couple the heat transfer source 156 to the channel 152.

Figure 2:
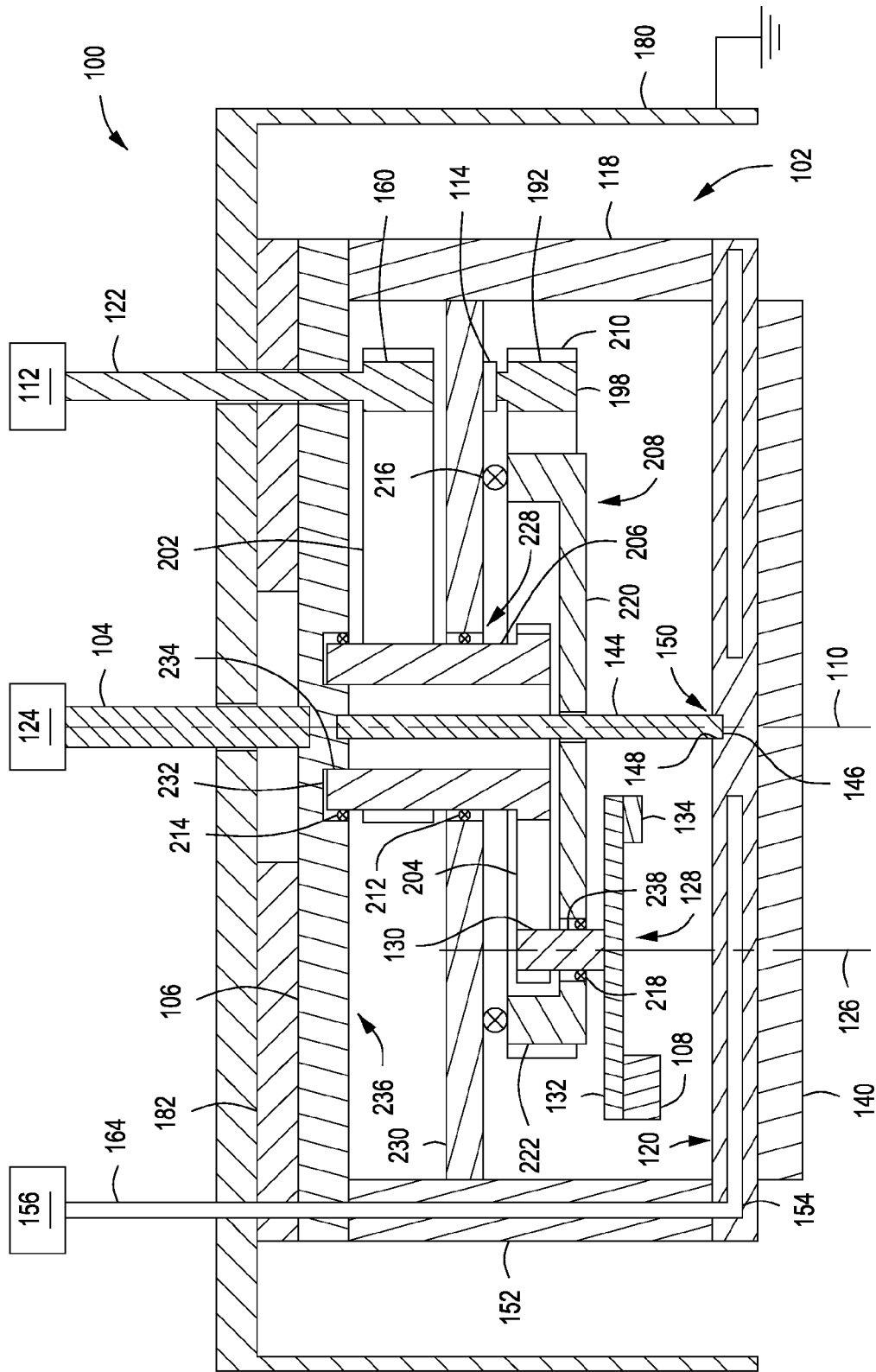
FIG. 2 depicts a sputter source for a process chamber in accordance with some embodiments of the present invention.
Figure 3:
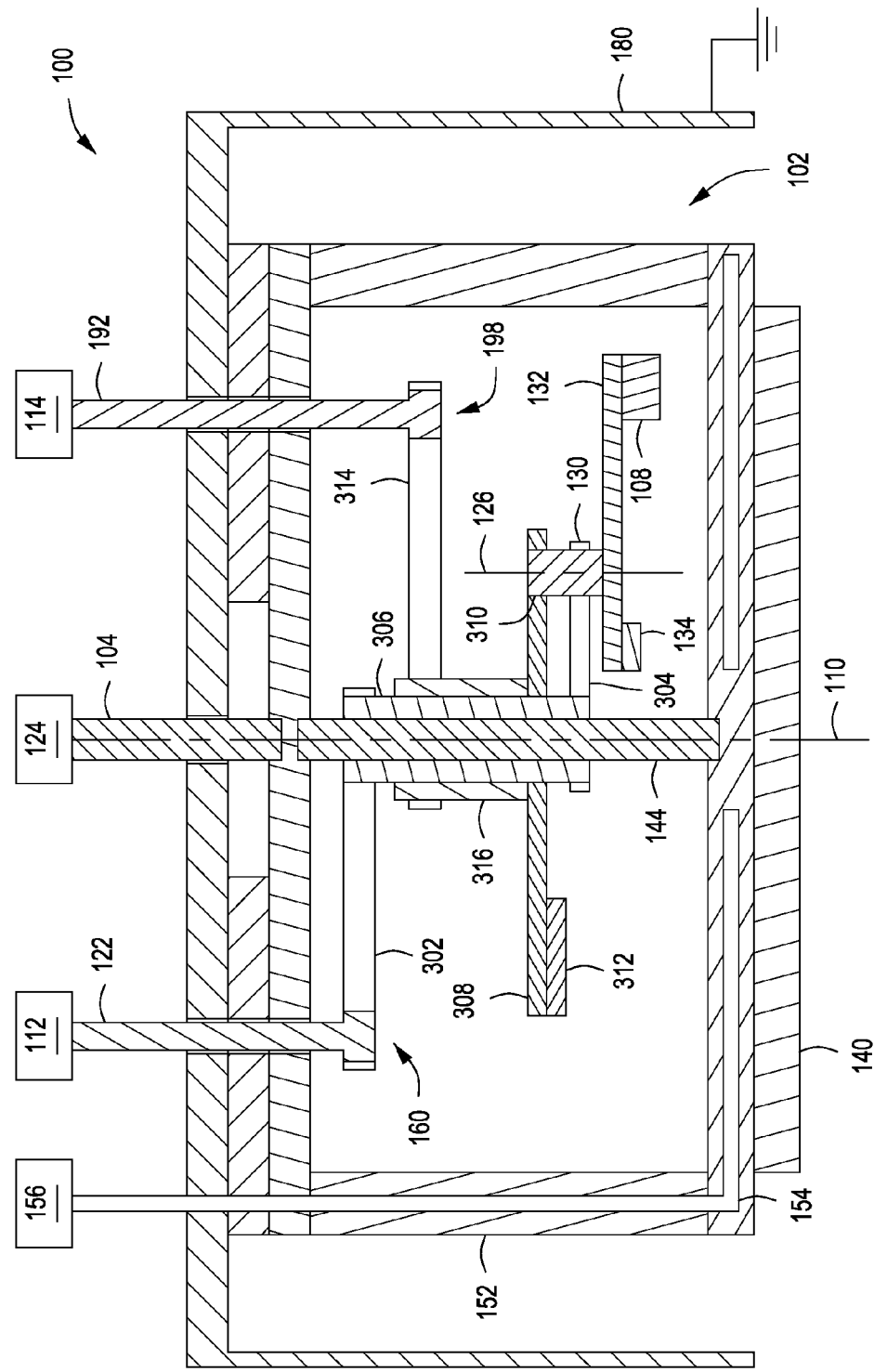
FIG. 3 depicts a sputter source for a process chamber in accordance with some embodiments of the present invention.

The electrical feed 104 facilitates delivery of power (e.g., RF or DC power) from a power supply 124 to the target 140 via the sides 118 of the first enclosure 102. In some embodiments, the electrical feed 104 is coupled to the first enclosure 102 proximate the central axis 110 of the first enclosure 102 to facilitate a uniform and symmetrical distribution of power to the target 140 from each side of the target 140. The electrical feed 104 may be fabricated from any suitable process compatible conductive material. For example, in some embodiments, the electrical feed 104 may be fabricated from a metal, for example, such as aluminum, an aluminum alloy, stainless steel, or the like. The electrical feed 104 may be a rod coupled to the first enclosure 102 along the central axis 110, as illustrated in FIGS. 1-3.

The one or more magnets 108 are disposed proximate the back side 142 of the target 140. The one or more magnets 108 create a magnetic field that extends beneath the target 140 to facilitate control over at least one of an amount, location with respect to the target, or directionality of the material sputtered from the target 140. The one or more magnets 108 may be any type of magnet suitable to create the desired magnetic field, for example, such as permanent magnets (e.g., a neodymium (NdFeB) magnet) or electromagnets. The one or more magnets 108 may be arranged in any manner to produce a desired magnetic field, such as open loops, closed loops, combinations thereof, and the like.

The one or more magnets 108 are coupled to a magnet assembly 128 (e.g., a magnetron). In some embodiments, the magnet assembly 128 may generally comprise a support arm 132 coupled to a shaft 130, wherein the one or more magnets 108 are coupled to the support arm 132. In some embodiments, a counter weight 134 may be coupled to the support arm 132 opposite the one or more magnets 108. When present, the counter weight 134 facilitates even rotation of the support arm 132. In some embodiments, the magnet assembly 128 may be supported by an outer carriage 174 disposed within the inner enclosure 102. In such embodiments, the shaft 130 may be disposed within a through hole 184 formed in a bottom 186 of the outer carriage 174, thereby rotatably coupling the shaft 130 to the outer carriage 174. In some embodiments, a bearing 103 (e.g., a rolling-element bearing such as a ball bearing) may be disposed within the through hole 184 between the bottom 186 of the outer carriage 174 and the shaft 130 to provide smooth rotation of the shaft 130 and facilitate rotatably coupling the shaft 130 to the outer carriage 174. In operation, as the shaft 130 is rotated within the through hole 184, the one or more magnets 108 rotate about a central axis 126 of the magnet assembly 128.

The first rotational actuator 112 is disposed off-axis with respect to the central axis 110 of the first enclosure 102 and facilitates rotation of the one or more magnets 108 with respect to the central axis 126 of the magnet assembly 128. A first shaft 122 is disposed in a through hole 158 formed in the top 106 of the first enclosure 102 and is coupled to, and rotated by, the first rotational actuator 112. In some embodiments, a bearing 178 may be disposed within the through hole 158 to facilitate smooth and/or even rotation of the first shaft 122.

In some embodiments, the first shaft 122 has an end 160 configured to interface with an inner surface 162 of an inner carriage 136 disposed within the first enclosure 102. In some embodiments, the end 160 of the first shaft 122 may comprise features (e.g., teeth) that interface with mating features (e.g., mating teeth) formed in an inner surface 162 of the inner carriage 136. In some embodiments, the end 160 of the first shaft 122 may be, for example, a wheel or sprocket coupled to the first shaft 122.

The inner carriage 136 is disposed about the support shaft 144 and rotates about the central axis 110 of the first enclosure 102. In some embodiments, the inner carriage 136 is ring shaped, having sides 170, an open top 188 and an open bottom 190. The inner surface 162 of the inner carriage 136 interfaces with the first shaft 122 and the shaft 130 of the magnet assembly 128 to facilitate rotation of the magnet assembly 128 upon rotation of the first shaft 122. In some embodiments, the inner carriage 136 may be supported by the outer carriage 174 (as described below). In such embodiments, a bearing 176 may be disposed between the inner carriage 136 and outer carriage 174 to allow for independent rotation of each of the inner carriage 136 and outer carriage 174. In operation, the first rotational actuator 112 rotates the shaft 122, which in turn rotates the inner carriage 136 about the central axis 110 of the first enclosure 110, thereby rotating the one or more magnets 108 about the central axis 126 of the magnet assembly 128.

The second rotational actuator 114 is disposed off-axis with respect to the central axis 110 of the first enclosure 102 and facilitates rotation of the one or more magnets 108 with respect to a central axis 110 of the first enclosure 102. A second shaft 192 is disposed in a through hole 194 formed in the top 106 of the first enclosure 102 and is coupled to, and rotated by, the second rotational actuator 114. In some embodiments, a bearing 196 may be disposed within the through hole 194 of the top 106 to facilitate smooth and/or even rotation of the second shaft 192.

In some embodiments, the second shaft 192 has an end 198 configured to interface with an inner surface 101 of the outer carriage 178. In some embodiments, the end 198 of the second shaft 192 may comprise features (e.g., teeth) that interface with mating features (e.g., mating teeth) formed in an inner surface 101 of the outer carriage 174. In some embodiments, the end 198 of the second shaft 192 may be, for example, a wheel or sprocket coupled to the second shaft 192.

The outer carriage 174 is disposed about the inner carriage 136 and rotates about the central axis 110 of the first enclosure 102. In some embodiments, the outer carriage 174 comprises sides 168 and the bottom 186. In some embodiments, the support column 144 is disposed through a hole 172 formed in the bottom 186 of the outer carriage 174. In some embodiments, the outer carriage 174 is supported by the first enclosure 102. In such embodiments, one or more bearings 192, 194 may be disposed between the outer carriage 174 and the first enclosure 102 to movably couple the outer carriage 174 to the first enclosure 102. In operation, the second rotational actuator 114 rotates the second shaft 192, which in turn rotates the outer carriage 174 about the central axis 110 of the first enclosure 110, thereby rotating the one or more magnets 108 about the central axis 110 of the first enclosure 110.

The inventors have observed that providing rotation of the magnet about two separate axes (e.g., the central axis of the first enclosure 102 and the central axis 126 of the magnet assembly 128) allows for a more precise placement of the one or more magnets 108 in a desired area with respect to the target 140, as compared to, for example, conventional magnetron assemblies utilizing only one axis of rotation. In addition, the inventors have observed that providing rotation from an off-axis position (e.g., the off-axis placement of the first actuator 112 and second actuator 114 with respect to the central axis 110 of the first enclosure 102) as described in the above embodiments, allows the power to be provided centrally with respect to the target 140, thereby providing a more uniform and symmetrical distribution of power to the target 140 as compared to power provided to the target 140 from an off-axis position. In addition, providing rotation from an off-axis position further allows for the target 140 to be supported from an area proximate the center 150 of the target 140 (e.g., via support column 144), thus minimizing bowing of the target 140.

Although the two-axis rotation of the one or more magnets 108 is described above as being provided via a combination of the inner carriage 136 and the outer carriage 174, the one or more magnets 108 may be rotated in the two-axis rotation via other off-axis rotational configurations.

For example, in some embodiments the first rotational actuator 112 may provide rotation of the one or more magnets 108 about the central axis 126 of the magnet assembly 128 via a first belt 202, a second belt 204, and a rotatable shaft 206, such as shown in FIG. 2.

In some embodiments, the rotatable shaft 206 is rotatably coupled to the first enclosure 102 and disposed about the support column 144. In such embodiments, the rotatable shaft 206 may be supported by the top 106 and/or cross member 230 disposed within the first enclosure 102. In embodiments where the rotatable shaft 206 is supported by the top 106, a channel 234, configured to accommodate an end 232 of the rotatable shaft 206, may be formed in a bottom surface 236 of the top 106. In such embodiments, a bearing 214 may be disposed between the end 232 of the rotatable shaft 206 and the channel 234 to rotatably couple the rotatable shaft 206 to the top 106 of the first enclosure 102. Alternatively, or in combination, in embodiments where the rotatable shaft 206 is supported by the cross member 230, the rotatable shaft 206 may be disposed within a through hole 228 formed in the cross member 230. In such embodiments, a bearing 212 may be disposed within the through hole 228 and between the cross member 230 and the rotatable shaft 206 to rotatably couple the rotatable shaft 206 to the cross member 230.

The magnet assembly 128 is rotatably coupled to a lower carriage 208 that is disposed beneath, and supported by, the cross member 230. In some embodiments, the lower carriage 208 comprises sides 222 and a bottom 220 and is rotatably coupled to the cross member 230 via a bearing 216. In some embodiments, the shaft 130 of the magnet assembly is disposed within a through hole 238 formed in the bottom 229 of the lower carriage 208. In such embodiments a bearing 218 may be disposed within the through hole 238 and between the bottom 20 of the lower carriage 208 and the shaft 130 of the magnet assembly rotatably couple the shaft 130 of the magnet assembly 128 to the bottom 220 of the lower carriage 208.

In operation of the first belt 202, second belt 204 and rotatable shaft 206 as described above, the end 160 of the first shaft 122 interfaces with the first belt 202. The first belt 202 also interfaces with the rotatable shaft 206, thus facilitating rotation of the rotatable shaft 206 about the central axis 110 of the first enclosure 102 upon rotation of the first shaft 122. The second belt 204 interfaces with the rotatable shaft 206 and the shaft 130 of the magnet assembly 128, thus facilitating rotation of the shaft 130 (and therefore, the one or more magnets 108) of the magnet assembly 128 about a central axis 126 of the magnet assembly 128 upon rotation of the rotatable shaft 130. As such, the first rotational actuator 112 rotates the first shaft 122, causing the first belt 202 to rotate the rotatable shaft 206. As the rotatable shaft 206 is rotated, the second belt 204 rotates the shaft 130 of the magnet assembly 128, thereby rotating the magnet 128 about the central axis 126 of the magnet assembly 128.

In some embodiments, the second rotational actuator 114 may provide rotation of the one or more magnets 108 about the central axis 110 of the first enclosure 102 via a third belt 210 and the lower carriage 208. In such embodiments, the second rotational actuator 114 may be disposed within the inner enclosure 102, wherein the second rotational actuator 114 is coupled to and supported by, for example, the cross member 230.

In operation of the third belt 210 and lower carriage 208, the end 198 of the second shaft 192 interfaces with the third belt 210. The third belt 210 also interfaces with the lower carriage 208, thus facilitating rotation of the lower carriage 208 about the central axis 110 of the first enclosure 102 upon rotation of the second shaft 192. As such, the second rotational actuator 114 rotates the second shaft 192, causing the third belt 210 to rotate the lower carriage 208, thereby rotating the magnet 128 about the central axis 110 of the first enclosure 102.

In some embodiments, the first rotational actuator 112 may provide rotation of the one or more magnets 108 about the central axis 126 of the magnet assembly 128 via a first belt 302, a second belt 304, and an inner rotatable sleeve 306, such as shown in FIG. 3.

In some embodiments, the inner rotatable sleeve 306 is disposed about, and is rotatably coupled to, the support column 144. In such embodiments, one or more bearings (not shown), may be disposed between the support column 144 and inner rotatable sleeve 306 to facilitate rotatably coupling the support column 144 to the inner rotatable sleeve 306.

In some embodiments, the magnet assembly 128 is rotatably coupled to a support arm 308. In such embodiments, the shaft 130 of the magnet assembly 128 may be disposed within a through hole 310 formed in the support arm 308. In some embodiments, one or more bearings (not shown), may be disposed within the through hole 310 and between the support arm 308 and the shaft 130 of the magnet assembly 128 to facilitate rotatably coupling the magnet assembly 128 to the support arm 308.

In some embodiments, the support arm 308 is coupled to an outer sleeve 316 that is disposed about, and rotates independent of, the inner sleeve 306. In some embodiments, a bearing (not shown) may be disposed between the inner sleeve 306 and outer sleeve 316 to rotatably couple the inner sleeve 306 to the outer sleeve 316. In some embodiments, a counter weight 312 may be coupled to the support arm 308 opposite the magnet assembly 128 to facilitate smooth rotation of the support arm 308.

In operation of the first belt 302, second belt 304, and inner rotatable sleeve 306 as described above, the end 160 of the first shaft 122 interfaces with the first belt 302. The first belt 302 also interfaces with the inner rotatable sleeve 306, thus facilitating rotation of the inner rotatable sleeve 306 upon rotation of the first shaft 112. The second belt 304 interfaces with the inner rotatable sleeve 306 and the shaft 130 of the magnet assembly 128, thus facilitating rotation of the shaft 130 (and therefore, the one or more magnets 108) of the magnet assembly 128 about a central axis 126 of the magnet assembly 128 upon rotation of the inner rotatable sleeve 306. As such, the first rotational actuator 112 rotates the first shaft 122, causing the first belt 302 to rotate the inner rotatable sleeve 306. As the inner rotatable sleeve 306 is rotated, the second belt 304 rotates the shaft 130 of the magnet assembly 128, thereby rotating the magnet 128 about the central axis 126 of the magnet assembly 128.

In some embodiments, the second rotational actuator 114 may provide rotation of the one or more magnets 108 about the central axis 110 of the first enclosure 102 via a third belt 314 and the outer sleeve 316. In such embodiments, the second rotational actuator 114 may be disposed off-axis, for example, such as described above with respect to FIG. 1.

In operation of the third belt 314 and outer sleeve 316, the end 198 of the second shaft 192 interfaces with the third belt 314. The third belt 314 also interfaces with the outer sleeve 316, thus facilitating rotation of the outer sleeve 316 about the central axis 110 of the first enclosure 102 upon rotation of the second shaft 192. As such, the second rotational actuator 114 rotates the second shaft 192, causing the third belt 314 to rotate the outer sleeve 316, thereby rotating the supporting arm 308, thus rotating the magnet 128 about the central axis 110 of the first enclosure 102.

Figure 4:
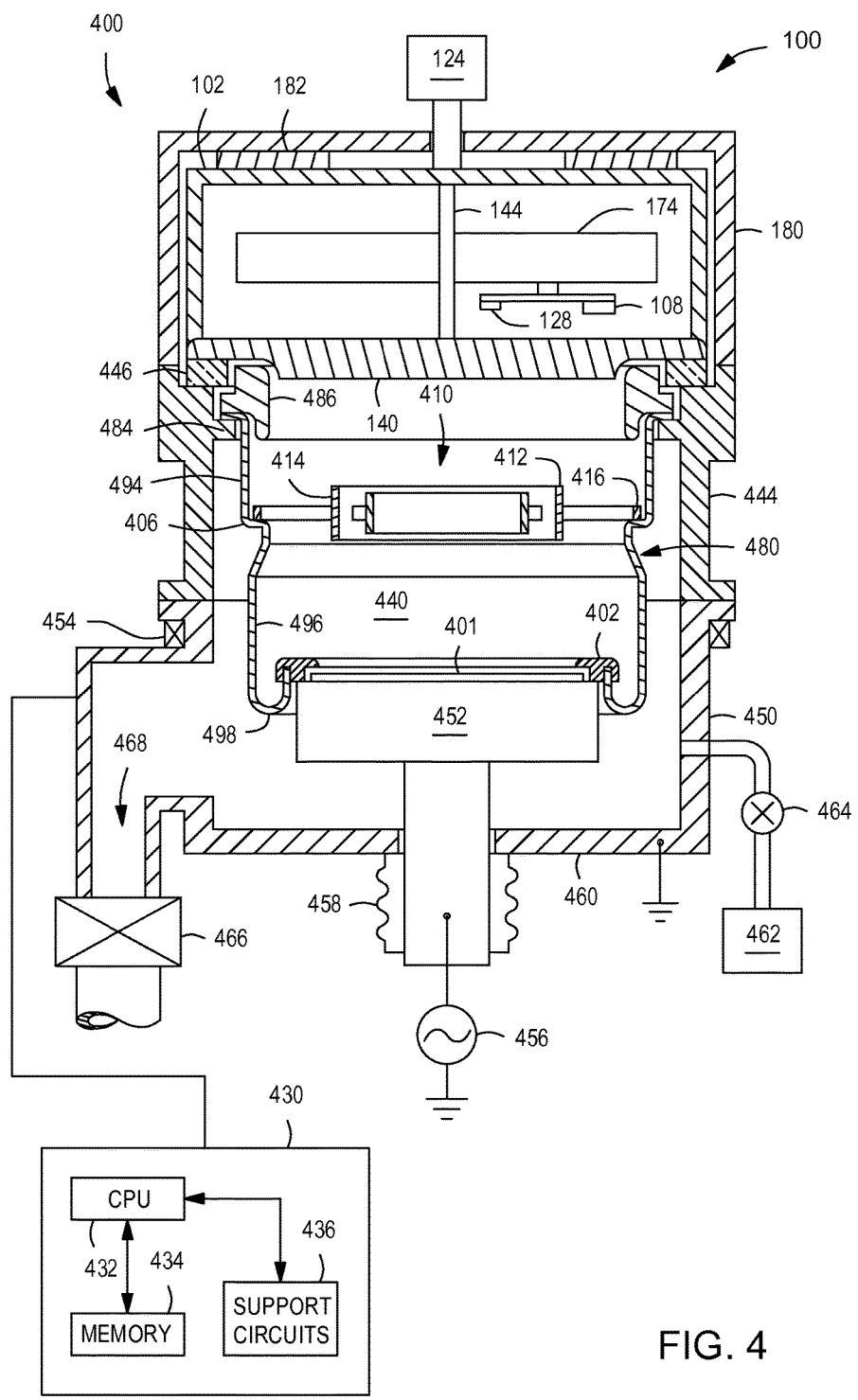
FIG. 4 depicts a process chamber suitable for use with a sputter source for a process chamber in accordance with some embodiments of the present invention.

FIG. 4 depicts a process chamber suitable for use with a power source for a process chamber in accordance with some embodiments of the present invention. Examples of suitable process chambers include the ENDURA® EXTENSA TTN and ENDURA® ENCORE processing chambers, both commercially available from Applied Materials, Inc., of Santa Clara, Calif. It is contemplated that other processing chambers, including those from other manufacturers, may also be utilized to perform the present invention.

In some embodiments, the process chamber 400 contains a substrate support pedestal 452 for receiving the substrate 401 thereon, and the sputtering source 100. The substrate support pedestal 452 may be located within a grounded enclosure wall 450, which may be a chamber wall (as shown) or a grounded shield (not shown). The substrate support pedestal 452 may include any suitable means (not shown) of providing heat to the substrate 401, for example, such as a resistive heating element, radiant cavity and light source, or the like.

In some embodiments, the target 140 may be supported on a grounded conductive aluminum adapter 444 through a dielectric isolator 446. The substrate support pedestal 452 has a material-receiving surface facing the principal surface of the target 140 and supports the substrate 401 to be sputter coated in planar position opposite to the principal surface of the target 140. The substrate support pedestal 452 may support the substrate 401 in a central region 440 of the process chamber 400. The central region 440 is defined as the region above the substrate support pedestal 452 during processing (for example, between the target 140 and the substrate support pedestal 452 when in a processing position).

The substrate support pedestal 452 is vertically movable through a bellows 458 connected to a bottom chamber wall 460 to allow the substrate 401 to be transferred onto the substrate support pedestal 452 through a load lock valve (not shown) in the lower portion of the process chamber 400 and thereafter raised to a deposition, or processing position as depicted in FIG. 4. One or more process gases may be supplied from a gas source 462 through a mass flow controller 464 into the lower part of the process chamber 400. An exhaust port 468 may be provided and coupled to a pump (not shown) via a valve 466 for exhausting the interior of the process chamber 400 and facilitating maintaining a desired pressure inside the processing chamber 400.

An RF power supply 456 may be coupled to the substrate support pedestal 452 in order to induce a negative DC bias on the substrate 401. In addition, in some embodiments, a positive or negative DC self-bias may form on the substrate 401 during processing. In other applications, the substrate support pedestal 452 may be grounded or left electrically floating.

The process chamber 400 further includes a grounded bottom shield 480 connected to a ledge 484 of the adapter 444. In some embodiments, a dark space shield 486 is supported on the bottom shield 480 and is fastened to the shield 480 by screws or other suitable manner. The metallic threaded connection between the bottom shield 480 and the dark space shield 486 allows the two shields 480, 486 to be grounded to the adapter 444. In some embodiments, the dark space shield 486 and the bottom shield 480 are fabricated in one piece. The adapter 444 in turn is sealed and grounded to the aluminum chamber sidewall 450. Both shields 480, 486 are typically formed from hard, non-magnetic stainless steel, or, for RF processes, a highly conductive material such as aluminum.

The bottom shield 480 extends downwardly in an upper tubular portion 494 of a first diameter and a lower tubular portion 496 of a second diameter. The bottom shield 480 extends along the walls of the adapter 444 and the chamber wall 450 downwardly to below a top surface of the substrate support pedestal 452 and returns upwardly until reaching a top surface of the substrate support pedestal 452 (e.g., forming a u-shaped portion 498 at the bottom). A cover ring 402 rests on the top of the upwardly extending inner portion of the bottom shield 480 when the substrate support pedestal 452 is in its lower, loading position but rests on the outer periphery of the substrate support pedestal 452 when it is in its upper, deposition position to protect the substrate support pedestal 452 from sputter deposition. An additional deposition ring (not shown) may be used to shield the periphery of the substrate 401 from deposition.

The process chamber 400 may also be adapted to provide a more directional sputtering of material onto a substrate. In some embodiments, directional sputtering may be achieved by positioning an optional collimator 410 between the target 140 and the substrate support pedestal 452 to provide a more uniform and symmetrical flux of deposition material to the substrate 401.

The collimator 410, when present, may rest on the ledge portion of the bottom shield 480, thereby grounding the collimator 410. The collimator 410 may be a metal ring and may include an outer tubular section and at least one inner concentric tubular section, for example, three concentric tubular sections 412, 414, 416 linked by cross struts 420, 418. The outer tubular section 416 rests on the ledge portion 406 of the bottom shield 480. The use of the bottom shield 480 to support the collimator 410 simplifies the design and maintenance of the process chamber 400. At least the two inner tubular sections 412, 414 are of sufficient height to define high aspect ratio apertures that partially collimate the sputtered particles. Further, the upper surface of the collimator 410 acts as a ground plane in opposition to the biased target 442, which facilitates keeping plasma electrons away from the substrate 401. The collimator should not be the ring type, but rather should be the monolithic type, application US20090308732

In some embodiments, a magnet 454 may be disposed about the process chamber 400 for selectively providing a magnetic field between the substrate support pedestal 452 and the target 140. For example, as shown in FIG. 4, the magnet 454 may be disposed about the outside of the chamber wall 450 in a region just above the substrate support pedestal 452 when in processing position. The magnet 454 may be an electromagnet and may be coupled to a power source (not shown) for controlling the magnitude of the magnetic field generated by the electromagnet.

A controller 430 is coupled to various components of the process chamber 300 for controlling the operation thereof and comprises a central processing unit (CPU) 432, a memory 434, and support circuits 436 for the CPU 432. The controller 430 may control the substrate processing apparatus directly, or via computers (or controllers) associated with particular process chamber and/or the support system components. The controller 430 may be one of any form of general-purpose computer processor that can be used in an industrial setting for controlling various chambers and subprocessors. The memory, or computer-readable medium, 434 of the CPU 432 may be one or more of readily available memory such as random access memory (RAM), read only memory (ROM), floppy disk, hard disk, flash, or any other form of digital storage, local or remote. The support circuits 436 are coupled to the CPU 432 for supporting the processor in a conventional manner. These circuits include cache, power supplies, clock circuits, input/output circuitry and subsystems, and the like. Processes to be performed in the process chamber 400 may be stored in the memory 434 as software routine that may be executed or invoked to control the operation of the process chamber 400. The software routine may also be stored and/or executed by a second CPU (not shown) that is remotely located from the hardware being controlled by the CPU 432.

Therefore, embodiments of a power source for a process chamber have been provided herein. In at least some embodiments, the inventive power source may advantageously facilitate accurate movement of one or more magnets with respect to a target and allow the use of a target having an increased thickness as compared to conventional targets, thereby providing a target with a longer useful life, as compared to conventional targets.

While the foregoing is directed to embodiments of the present invention, other and further embodiments of the invention may be devised without departing from the basic scope thereof.

The invention claimed is:

1. A sputter source for a process chamber, comprising:
a first enclosure having a top, sides and an open bottom;
a target coupled to the open bottom of the first enclosure;
an electrical feed coupled to the top of the first enclosure proximate a central axis of the first enclosure to provide power to the target via the first enclosure;
a magnet assembly having a shaft, a support arm coupled to the shaft, and a magnet coupled to the support arm disposed within the first enclosure;
a first rotational actuator disposed off-axis with respect to the central axis of the first enclosure and rotatably coupled to the magnet to rotate the magnet about the central axis of the magnet assembly;
a second rotational actuator disposed off-axis with respect to the central axis of the first enclosure and rotatably coupled to the magnet to rotate the magnet about a central axis of the first enclosure; and
a support column disposed through the central axis of the first enclosure, the support column fixed to the top of the first enclosure and the target.

2. The sputter source of claim 1, further comprising:
a second enclosure disposed about the first enclosure, the second enclosure coupled to ground.

3. The sputter source of claim 2, further comprising:
an insulator disposed between the first enclosure and the second enclosure to electrically isolate the first enclosure from the second enclosure.

4. The sputter source of claim 1, further comprising:
a channel formed on the sides of the first enclosure to provide a heat transfer fluid to a channel formed in the target.

5. The sputter source of claim 1, further comprising:
a ring shaped inner carriage disposed within the first enclosure, wherein the shaft of the magnet assembly and the first rotational actuator each interface with an inner surface of the inner carriage such that rotation of the first rotational actuator rotates the inner carriage about the central axis of the first enclosure and rotates the magnet assembly about the central axis of the magnet assembly.

6. The sputter source of claim 5, further comprising:
an outer carriage having sides and a bottom disposed about the inner carriage, wherein the shaft of the magnet assembly is rotatably coupled to the bottom of the outer carriage and wherein the first rotational actuator interfaces with the sides of the outer carriage such that rotation of the first rotational actuator rotates the outer carriage about the central axis of the first enclosure and rotates the magnet assembly about the central axis of the first enclosure.

7. The sputter source of claim 6, wherein the outer carriage is rotatably coupled to the first enclosure.

8. The sputter source of claim 1, further comprising a rotatable shaft disposed within the first enclosure and about the central axis of the first enclosure, wherein the first rotational actuator is rotatably coupled to the rotatable shaft, and wherein the rotatable shaft is rotatably coupled to the shaft of the magnet assembly.

9. The sputter source of claim 8, wherein the rotatable shaft is rotatably coupled to a cross member disposed within the first enclosure.

10. The sputter source of claim 6, further comprising:
a lower carriage having sides and a bottom disposed within the first enclosure and rotatable about the central axis of the first enclosure, wherein the shaft of the magnet assembly is rotatably coupled to the bottom of the outer carriage, and wherein the second rotational actuator is rotatably coupled to the lower carriage.

11. The sputter source of claim 10, wherein the second rotational actuator is disposed within the first enclosure.

12. The sputter source of claim 11, wherein the second rotational actuator is coupled to a cross member disposed within the first enclosure.

13. The sputter source of claim 1, further comprising:
an inner sleeve disposed with the first enclosure and rotatable about the central axis of the first enclosure, wherein the first rotational actuator is rotatably coupled to the inner sleeve, and wherein the inner sleeve is rotatably coupled to the shaft of the magnet assembly.

14. The sputter source of claim 1, further comprising:
an outer sleeve disposed with the first enclosure and rotatable about the central axis of the first enclosure;
a third belt rotatably coupling the second rotational actuator to the outer sleeve; and
a support arm coupled to the outer sleeve, wherein the magnet assembly is coupled to the support arm.

15. A process chamber for depositing materials atop a substrate, comprising:
a substrate support disposed within the process chamber;
a sputter source disposed within the process chamber opposite the substrate support, the sputter source comprising;
a first enclosure having a top, sides and an open bottom;
a target coupled to the open bottom of the first enclosure;
an electrical feed coupled to the top of the first enclosure along a central axis of the first enclosure to provide power to the target via the first enclosure, wherein the electrical feed is a rod coupled to the top of the first enclosure at a point coincident with the central axis;
a magnet assembly having a shaft, a support arm coupled to the shaft, and a magnet coupled to the support arm disposed within the first enclosure;
a first rotational actuator disposed off-axis with respect to the central axis of the first enclosure and rotatably coupled to the magnet to rotate the magnet about the central axis of the first enclosure; and
a second rotational actuator disposed off-axis with respect to the central axis of the first enclosure and rotatably coupled to the magnet to rotate the magnet about a central axis of the magnet assembly.

16. The process chamber of claim 15, further comprising:
a ring shaped inner carriage disposed within the first enclosure, wherein the shaft of the magnet assembly and the first rotational actuator each interface with an inner surface of the inner carriage such that rotation of the first rotational actuator rotates the inner carriage about the central axis of the first enclosure and rotates the magnet assembly about the central axis of the magnet assembly; and
an outer carriage having sides and a bottom disposed about the inner carriage, wherein the shaft of the magnet assembly is rotatably coupled to the bottom of the outer carriage and wherein the first rotational actuator interfaces with the sides of the outer carriage such that rotation of the first rotational actuator rotates the outer carriage about the central axis of the first enclosure and rotates the magnet assembly about the central axis of the first enclosure.

17. The process chamber of claim 16, further comprising:
a rotatable shaft disposed within the first enclosure and about the central axis of the first enclosure;
a first belt rotatably coupling the first rotational actuator to the rotatable shaft;
a second belt rotatably coupling the rotatable shaft to the shaft of the magnet assembly;
a lower carriage having sides and a bottom disposed within the first enclosure and rotatable about the central axis of the first enclosure, wherein the shaft of the magnet assembly is rotatably coupled to the bottom of the outer carriage; and
a belt rotatably coupling the second rotational actuator to the lower carriage.

18. The process chamber of claim 15, further comprising:
an inner sleeve disposed with the first enclosure and rotatable about the central axis of the first enclosure;
a first belt rotatably coupling the first rotational actuator to the inner sleeve;
a second belt rotatably coupling the inner sleeve to the shaft of the magnet assembly;
an outer sleeve disposed with the first enclosure and rotatable about the central axis of the first enclosure;
a third belt rotatably coupling the second rotational actuator to the outer sleeve; and
a support arm coupled to the outer sleeve, wherein the magnet assembly is coupled to the support arm.

19. The process chamber of claim 15, further comprising:
a support column disposed through the central axis of the first enclosure, the support column coupled to the top of the first enclosure and the target.

20. A sputter source for a process chamber, comprising:
a first enclosure having a top, sides and an open bottom;
a target coupled to the open bottom of the first enclosure;
an electrical feed coupled to the top of the first enclosure along a central axis of the first enclosure to provide power to the target via the first enclosure, wherein the electrical feed is a rod;
a magnet assembly having a shaft, a support arm coupled to the shaft, and a magnet coupled to the support arm disposed within the first enclosure;
a first rotational actuator disposed off-axis with respect to the central axis of the first enclosure and rotatably coupled to the magnet to rotate the magnet about the central axis of the magnet assembly;
a second rotational actuator disposed off-axis with respect to the central axis of the first enclosure and rotatably coupled to the magnet to rotate the magnet about a central axis of the first enclosure; and
a support column disposed through the central axis of the first enclosure, the support column fixed with respect to the target and the top of the first enclosure beneath the rod.

* * * * *